United States Patent [19]

Yoshida et al.

[11] Patent Number: 5,696,400
[45] Date of Patent: Dec. 9, 1997

[54] MOS-TYPE SEMICONDUCTOR INTEGRATED CIRCUIT DEVICE

[75] Inventors: Shinichi Yoshida; Yutaka Saitoh; Jun Osanai, all of Chiba, Japan

[73] Assignee: Seiko Instruments Inc., Japan

[21] Appl. No.: 522,733

[22] Filed: Sep. 1, 1995

[30] Foreign Application Priority Data

Sep. 2, 1994 [JP] Japan .................................. 6-210209
Aug. 22, 1995 [JP] Japan .................................. 7-213844

[51] Int. Cl.⁶ .................................................. H01L 29/76
[52] U.S. Cl. ..................... 257/392; 257/339; 257/647; 257/648; 257/335; 257/500; 257/509
[58] Field of Search .......................... 257/392, 647, 257/648, 335, 339, 500, 509

[56] References Cited

U.S. PATENT DOCUMENTS

| | | | |
|---|---|---|---|
| 4,214,359 | 7/1980 | Kahng | 257/335 |
| 4,866,002 | 9/1989 | Shizukuishi et al. | 257/392 |
| 5,105,252 | 4/1992 | Kim et al. | 257/335 |
| 5,448,101 | 9/1995 | Ono et al. | 257/509 |
| 5,495,122 | 2/1996 | Tada | 257/392 |
| 5,497,021 | 3/1996 | Tada | 257/392 |

*Primary Examiner*—Sara W. Crane
*Assistant Examiner*—David B. Hardy
*Attorney, Agent, or Firm*—Adams & Wilks

[57] ABSTRACT

A semiconductor integrated circuit device comprises an input terminal for inputting a voltage, an output terminal for outputting a voltage, a MOS driver disposed between the input terminal and the output terminal for adjusting the voltage of the input terminal and transmitting it to the output terminal, and a MOS control circuit for controlling the MOS driver and feeding back voltage information of the output terminal. Each of the MOS driver and the MOS control circuit has a MOS transistor formed on a semiconductor substrate, and each MOS transistor has a source region, a drain region, a channel region disposed between the source region and the drain region, a gate insulating film disposed over the channel region, and a gate electrode disposed over the gate insulating film. The gate insulating films of the MOS transistors have different film thicknesses.

12 Claims, 8 Drawing Sheets

FIG. 10

MOS-TYPE SEMICONDUCTOR INTEGRATED CIRCUIT DEVICE

BACKGROUND OF THE INVENTION

This invention relates to improvement of the current value per unit channel and the switching speed of a MOS driver in a high withstand voltage MOS-type semiconductor integrated circuit device. (The high withstand voltage referred to in this invention indicates a voltage of over 24V.)

A semiconductor integrated circuit device for a power source having a constant voltage output function (hereinafter called a voltage regulator) will be described below as an example.

Figure 2:
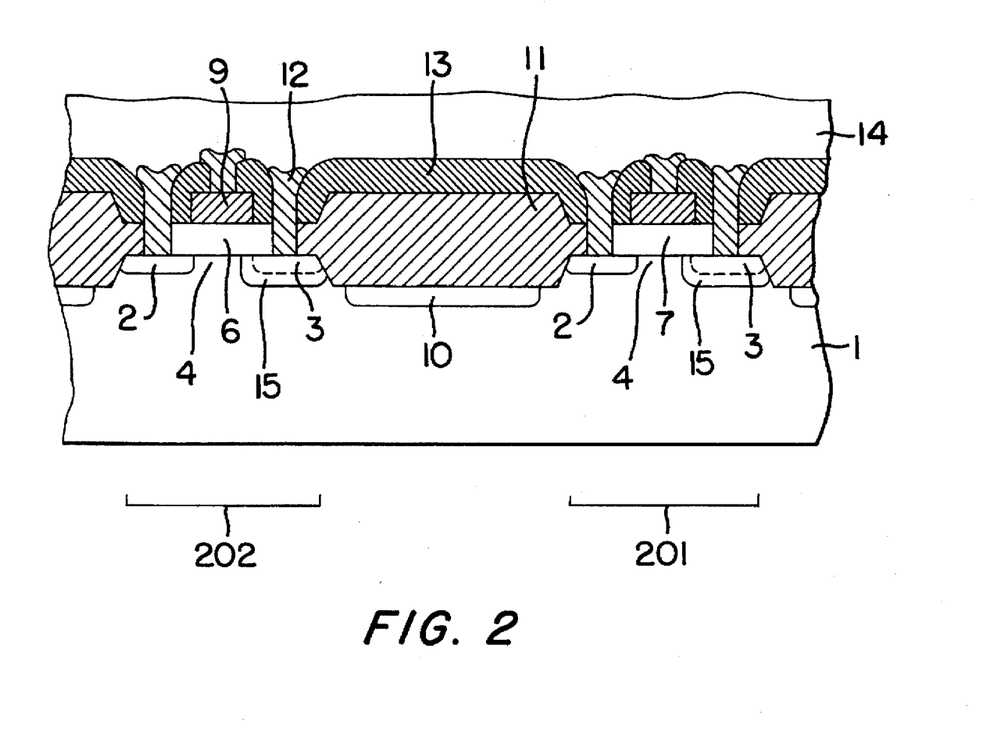
FIG. 2 is a sectional view of a MOS transistor of a conventional voltage regulator.

FIG. 2 is a sectional view of a MOS transistor of a case wherein a high withstand voltage MOS transistor of a conventional DDD (Double Diffused Drain) structure has been used. In MOS transistors consisting of a source region (2) and a drain region (3) of a second conductive type disposed with a gap provided therebetween on the surface of a silicon substrate (1) of a first conductive type and a double diffused drain region (15) of the second conductive type provided around the drain region and a channel-forming region (4) between the source region and the drain region and a gate insulating film (6), (7) provided on the channel-forming region and a gate electrode (9) provided on the gate insulating film, the gate insulating film (7) of a MOS driver and the gate insulating film (6) of a MOS control circuit have been of the same film thickness.

A voltage regulator takes in power from an input side and transmits the power to an output side, and by controlling the power transmitted stabilizes the output voltage. In this case, the greater the allowable input power (the input voltage×the input current) of the voltage regulator the greater the output power (the output voltage×the output current) can be made. When the output power becomes large, the voltage regulator can be used in fields in which it has not been used until now because of lack of power.

In the past, in order to raise the allowable input power the development of high withstand voltage MOS transistors has been promoted. By making MOS transistors high withstand voltage structures, allowable input voltages of voltage regulators have been increased.

However, because in order to realize a high withstand voltage MOS transistor it is necessary to consider surface breakdown withstand voltage and TDDB (Time Dependence Dielectric Breakdown; time dependence of insulating film breakdown) and the like, it has been necessary to make the gate insulating film of the MOS transistor considerably thick.

Also, because the gate insulating films of MOS transistors have been all of the same film thickness, if even in one place there is a MOS transistor to the gate electrode of which a high voltage will be applied, the gate insulating film thickness of all the MOS transistors has had to be made thick.

Because when the gate insulating film is thick the value of the current flowing per unit channel of the MOS transistor decreases and the switching speed becomes slow, with conventional voltage regulators there has been the problem that when the allowable input voltage is made high it becomes impossible to get output current.

SUMMARY OF THE INVENTION

In this invention, to solve the above-mentioned problems, the thickness of gate insulating films of circuits wherein the gate-substrate voltage differential is always small (for example MOS drivers and the like) is made thin and the thickness of gate insulating films of circuits wherein the gate-substrate voltage differential sometimes becomes large and sometimes becomes small (for example comparators) is made thick.

Also, to make the drain withstand voltage over 24V even when the gate insulating film is made thin, MOS transistors of a LOCOS-drain structure have been employed.

By employing the above-mentioned means, it is possible to improve the value of the current flowing per unit channel and the switching speed of a high withstand voltage MOS-type semiconductor integrated circuit device.

DETAILED DESCRIPTION OF THE PREFERRED EMBODIMENT

A circuit of a voltage regulator which is a first embodiment of a high withstand voltage MOS-type semiconductor integrated circuit device of the invention will be described with reference to block FIG. 5.

A voltage regulator of the invention comprises a Vref circuit (301), a ladder resistor (303), a comparator (302), a MOS driver (304) and a current limiting circuit (305).

The comparator receives a reference voltage generated by the Vref circuit (301) and an output voltage divided by the ladder resistor (303), and the MOS driver (304) receives an output signal sent from the comparator (302) and works so that an output voltage becomes constant at all times.

The current limiting circuit (305) limits the output current so that even if an output terminal (307) and a ground terminal (308) short-circuit, an excessive voltage is not impressed on the gate electrode of the MOS driver (304).

Figure 6:
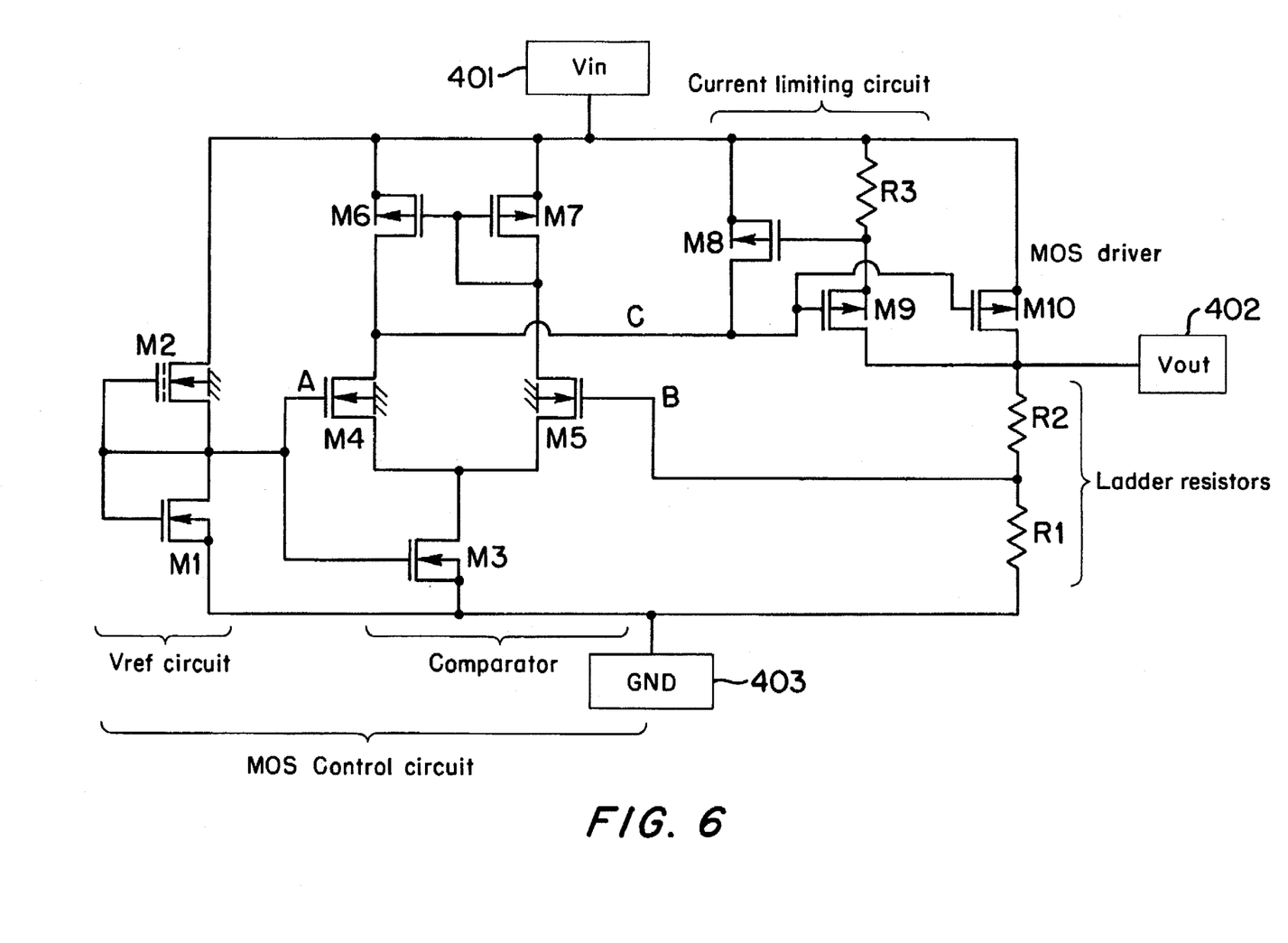
FIG. 6 is a circuit diagram of a voltage regulator of the first embodiment of the invention.

A circuit diagram of the first embodiment of the invention is shown in FIG. 6. The Vref circuit is made up of two MOS transistors M1 and M2, the comparator is made up of five MOS transistors M3 to M7, the current limiting circuit is made up of two MOS transistors M8 and M9 and a resistor R3, the MOS driver is made up of one MOS transistor M10 and the ladder resistor is made up of two resistors R1 and R2.

The voltage at point A (a reference voltage: Vref) is substantially equal to the sum of the absolute values of the threshold voltages of an enhancement-type MOS transistor (M1) and a depression-type MOS transistor (M2), and is held at a certain voltage (the reference voltage; Vref) at all times even if the input voltage (Vin) fluctuates. The comparator (comparing circuit) made up of the MOS transistors M3 to M7 compares the voltage of point A and the voltage of point B, and when the voltage of point A is higher than the voltage of point B, the voltage of point C lowers and the channel current of the MOS transistor M10 increases, thereby working so that the voltages of point A and point B become the same. The output voltage (Vout) is determined by the ratio of the ladder resistors R1 and R2, and because the voltage of point B is so adjusted by the MOS control circuit that it becomes the same as the voltage of point A (Vref), the output voltage Vout becomes Vout=Vref·(R+R2)/R1.

Next, the working of the current limiting circuit will be described. The current limiting circuit is made up of the two MOS transistors M8 and M9 and the one resistor R3. The transistor M9 has the same type (here, P-channel type), the same gate insulating film thickness (here, 300 Angstroms) and the same effective channel length (here, 3.0 µm) as the MOS driver M10. The channel width of the transistor M9 is narrower than that of the transistor M10 (here, 1/100) and the resistance value of R3 is low and determined by the threshold voltage of the transistor M8 and the limit current value (here, the threshold voltage of the transistor M8 is made −0.8V, the limit current value is made 1 A and the resistance value of the R3 is thus made 80 Ω). When a current of 1 A flows through the MOS transistor M10, because the transistor M9 and the transistor M10 form a current mirror circuit, a current of 0.01 A flows through the transistor M9 according to the ratio of the channel widths. The voltage drop in the R3 is 0.8V because the resistance value of the R3 is 80 Ω. When the voltage drop in the R3 becomes more than 0.8V, the transistor M8 comes ON. When the transistor M8 comes ON, the gate voltage of the transistor M10 becomes high (the gate-source voltage of the M10 becomes low) and the transistor M10 ceases to pass current.

Figure 1:
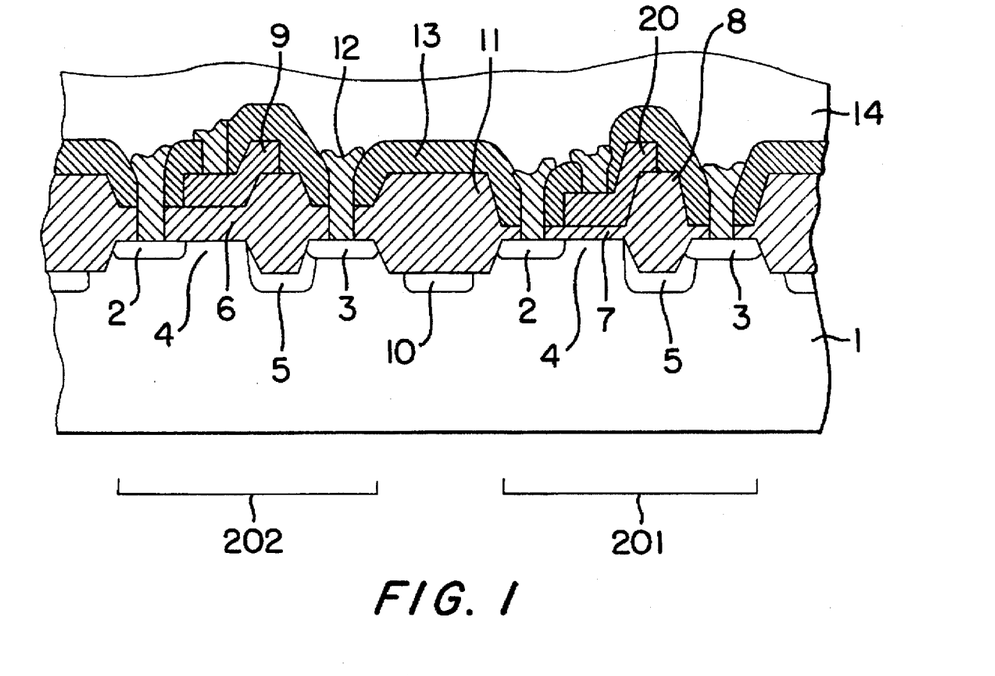
FIG. 1 is a sectional view of a MOS transistor of a voltage regulator of a first embodiment of the invention.

FIG. 1 is a sectional view of a MOS transistor of a voltage regulator of the first embodiment of the invention.

In a high withstand voltage MOS-type semiconductor integrated circuit device consisting of a source region (2) and a drain region (3) of a second conductive type disposed with a gap left therebetween on the surface of a silicon substrate (1) of a first conductive type, a channel-forming region (4) provided between the source region and the drain region, a drift region (5) of the second conductive type provided in part of the drain region (3) in contact with the channel-forming region and a gate insulating film (6), (7) provided on the channel-forming region, a locos drain oxide film (8) provided on the drift region, and a gate electrode (9) provided on the locos drain oxide film, the gate oxide film thickness of MOS control circuits (Vref circuits and comparators and the like) is 800 Å and the thickness of the gate oxide film of MOS drivers is 300 Å.

The reason for making the gate oxide film of the MOS control circuits 800 Å is that because the input voltage sometimes is applied fully to the gate electrodes of the MOS control circuit parts, the film thickness of the gate insulating film (6) of the MOS control circuit was made a thickness guaranteed for 10 years by TDDB with respect to the allowable input voltage and was made a film thickness of about the allowable input voltage divided by 3 MV/cm, ±10%. Specifically, in the case of a rated 24V it is made 800±80 Å.

Figure 3:
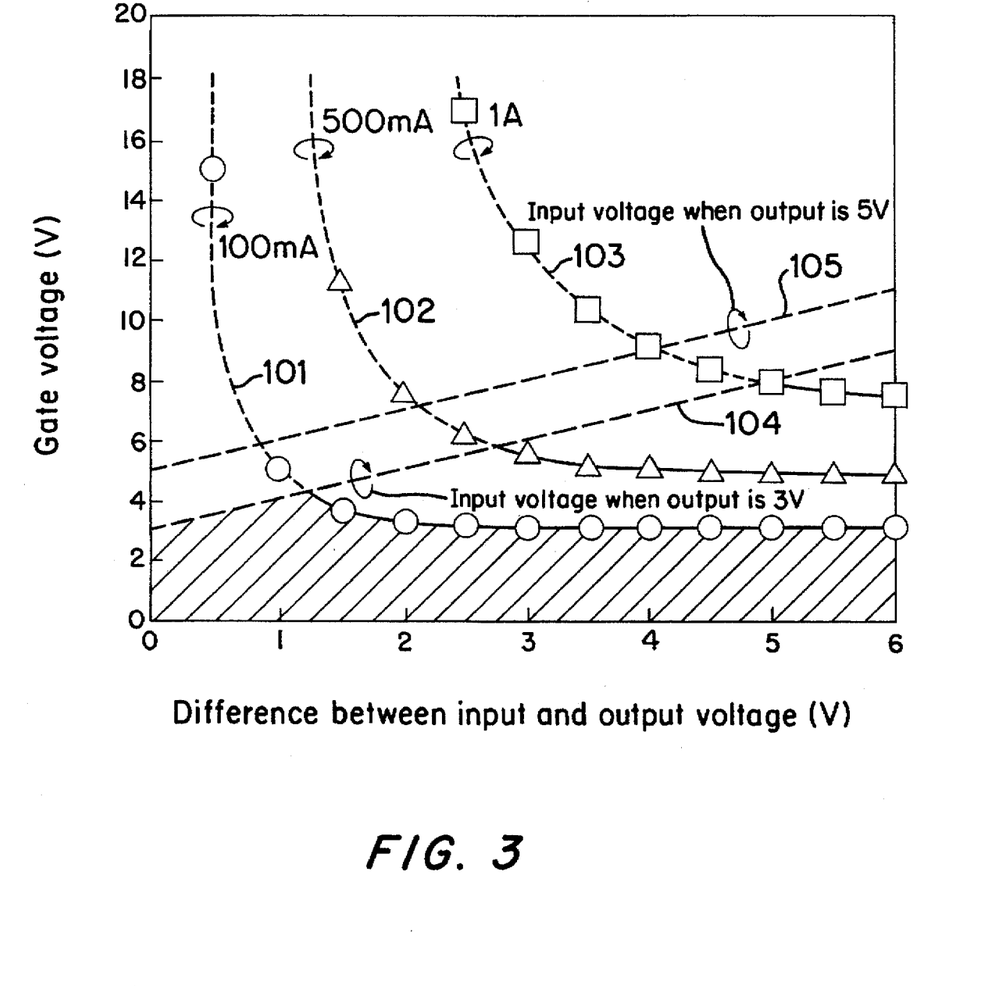
FIG. 3 is a graph showing a relationship between gate voltage and input-output voltage of a MOS driver of the voltage regulator of the first embodiment of the invention.

Because the output voltage from the MOS control circuit is impressed on the gate electrode of the MOS driver, the input voltage is not fully impressed thereon and the voltage range of the hatched area of FIG. 3 becomes the operating range. Explaining FIG. 3 in detail, the horizontal axis is the input-output voltage difference and the vertical axis is the gate voltage, and lines 101 to 103 show the gate voltages necessary for outputting 200 mA, 500 mA and 1 A, respectively. However, because the circuit construction is such that the gate voltage never exceeds the input voltage (never reaches gate voltages above those of the line 104 and the line 105), the operating range of the MOS driver is the hatched area.

From FIG. 3, the gate voltage (the gate-substrate/source voltage) of the MOS driver becomes about 9V at the most even when the output is 5V, 1 A. Therefore, the film thickness of the gate oxide film of the driver is made about the thickness of 9V divided by 3 MV/cm, ±10% (about 300±30 Angstroms).

However, what attention must be paid to here is that there are cases where the input voltage is fully impressed across the gate-drain of the MOS driver in OFF times. In this invention, in what is called a LOCOS-drain structure, the gate insulating film of a drain part (locos drain oxide film 8) is made thick and the drain withstand voltage is thereby increased.

Figure 4:
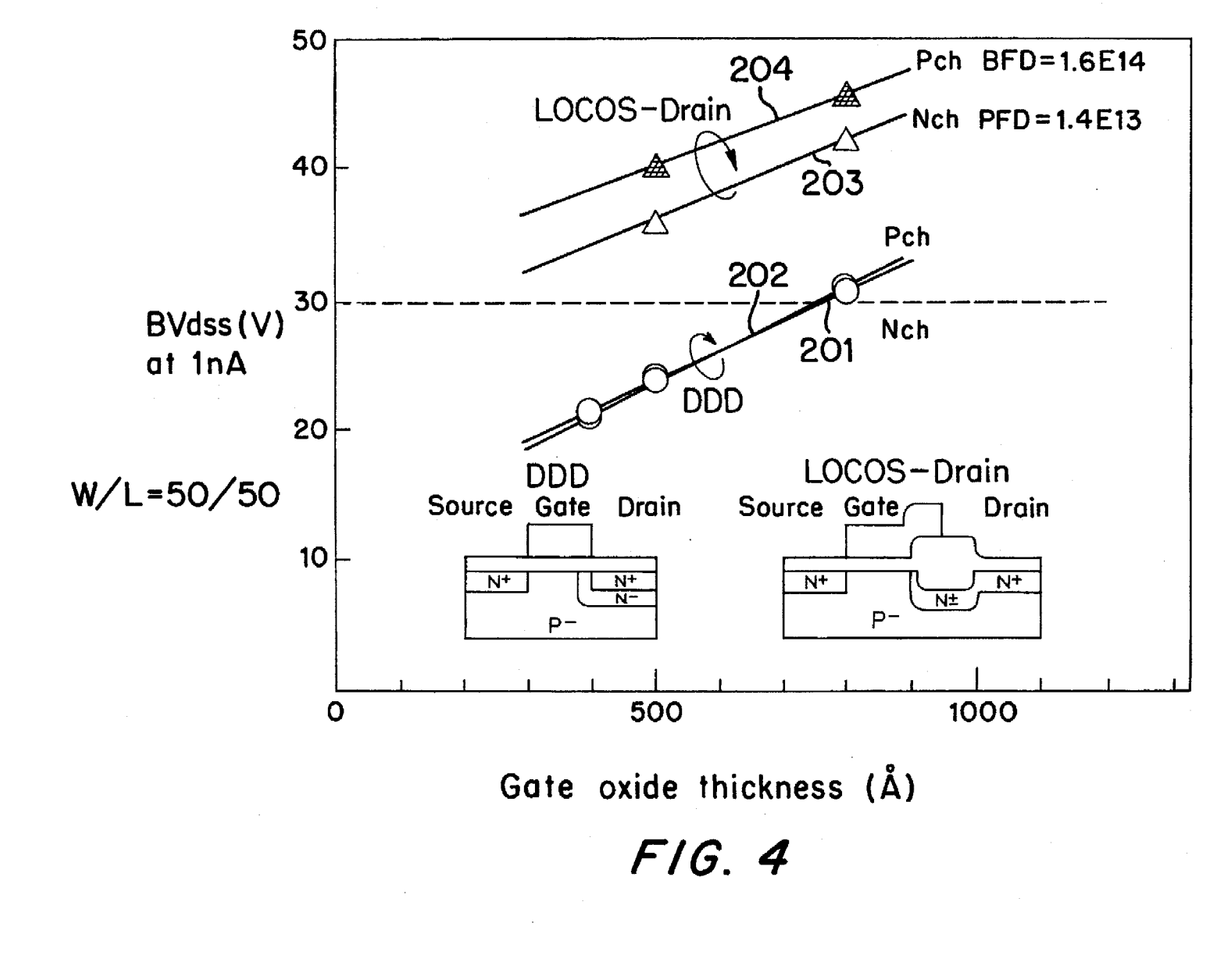
FIG. 4 is a graph showing a relationship between drain withstand voltage (BVdss) and gate oxide film thickness of a conventional DDD type MOS transistor and a LOCOS-drain type MOS transistor of the invention.

FIG. 4 shows a comparison of drain withstand voltages of a MOS transistor of a conventional DDD structure and a MOS transistor of a LOCOS-drain structure. The vertical axis of FIG. 4 shows the drain withstand voltage (BVdss) and the horizontal axis shows the gate oxide film thickness. Lines 201, 202 show DDD structure Nch and Pch drain withstand voltages, respectively, and lines 203 and 204 show LOCOS-drain structure Nch and Pch drain withstand voltages, respectively. In both the DDD structure, and the LOCOS-drain structure the drain withstand voltage falls when the gate insulating film thickness becomes thin. Because in a voltage regulator of the invention the input voltage is entirely fully impressed on the drain of the driver, with a MOS driver of a conventional DDD structure it was not possible to make the gate insulating film thin. By adopting the LOCOS-drain structure of the invention, for the first time it was possible to make the gate oxide film thickness of the MOS driver 300 Å.

Also, if the thicknesses of the locos oxide film (8) and a field oxide film (11) of a device-separating region are matched, a high withstand voltage MOS transistor can be made by an ordinary process for making a MOS of a conventional structure plus a 1 sheet mask step (this 1 sheet is used for making different oxide film thicknesses).

To make the film thicknesses of the locos drain oxide film (8) and the field oxide film (11) for device-separating, the drain withstand voltage of the MOS transistor and the threshold value of the field transistor for device-separating must both be above the rating (here, over 24V). Drain withstand voltages and field transistor threshold values (Vtpf) with respect to boron field dope and phosphorus field dope are shown in FIG. 7 and FIG. 8 respectively.

Figure 7:
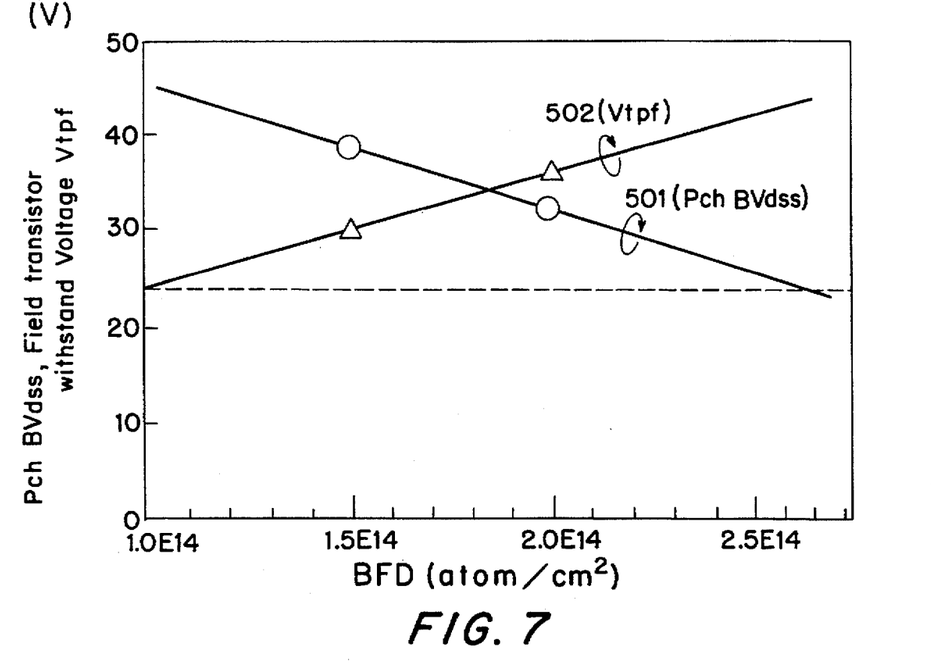
FIG. 7 is a graph showing a relationship of BFD with respect to drain withstand voltage (BVdss) and field transistor threshold value (Vtpf) of a LOCOS-drain type PMOS transistor of the invention.

FIG. 7 is a figure concerning BFD (Boron Field Dope). The vertical axis shows the drain withstand voltage and field transistor threshold value, and the horizontal axis shows the boron concentration. From FIG. 7, to make both the drain withstand voltage (501) and the field transistor threshold value (Vtpf) over 24V, the boron field dope dose quantity was made about 1.0E14 to 2.6E14/cm$^2$.

Figure 8:
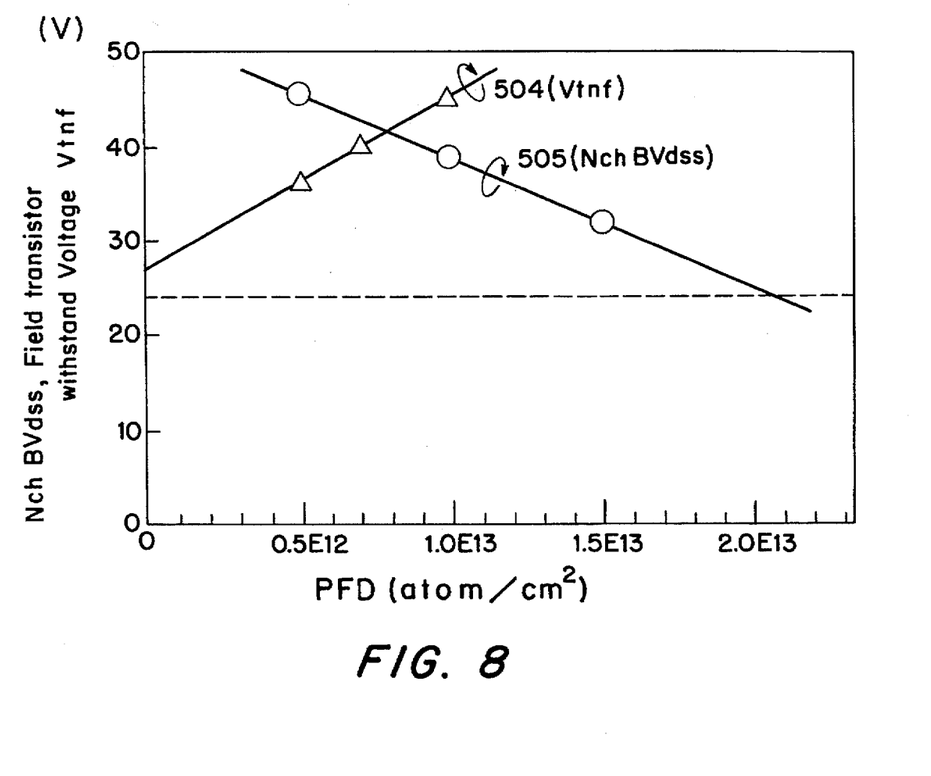
FIG. 8 is a graph showing a relationship of PFD with respect to drain withstand voltage (BVdss) and field transistor threshold value (Vtnf) of a LOCOS-drain type PMOS transistor of the invention.

FIG. 8 is a figure concerning PFD (Phos Field Dope). The vertical axis shows the drain withstand voltage (BVdss) and field transistor threshold value (Vtnf), and the horizontal axis shows the boron concentration. From FIG. 8, to make both the drain withstand voltage (505) and the field inversion voltage, that is, the field transistor threshold value voltage (504), over 24V, the boron field dope dose quantity was made about 1.0E14 to 2.6E14/cm$^2$. By setting the concentration as described above, it was possible to match the BFD and PFD dose quantities of the drift region and the device-separating region.

Figure 5:
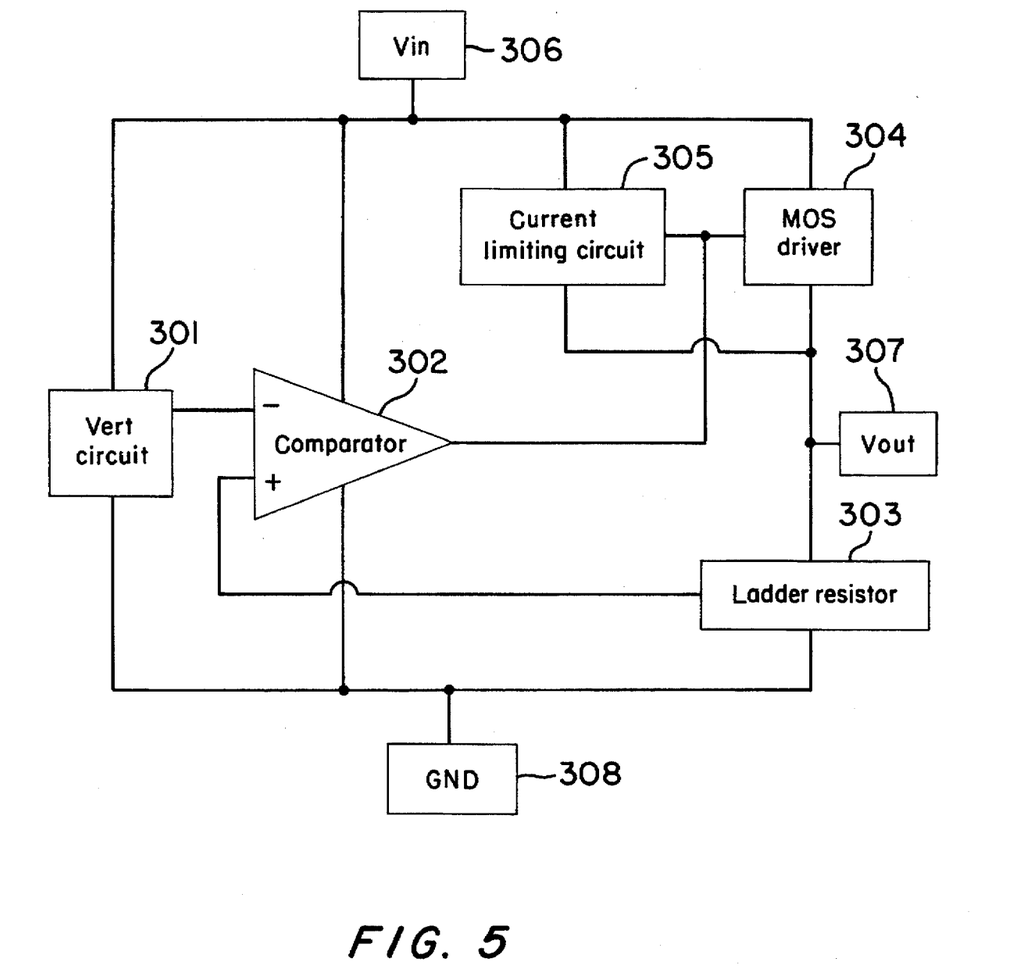
FIG. 5 is a circuit block diagram of a voltage regulator of the first embodiment of the invention.

If, as shown in FIG. 5, a current limiting circuit (305) is also added to the voltage regulator, even if the output terminal (307) short-circuits with the ground terminal (308), if no more than 1 A is allowed to flow, the gate voltage of the MOS transistor will never exceed 9V.

Second Embodiment

Figure 9:
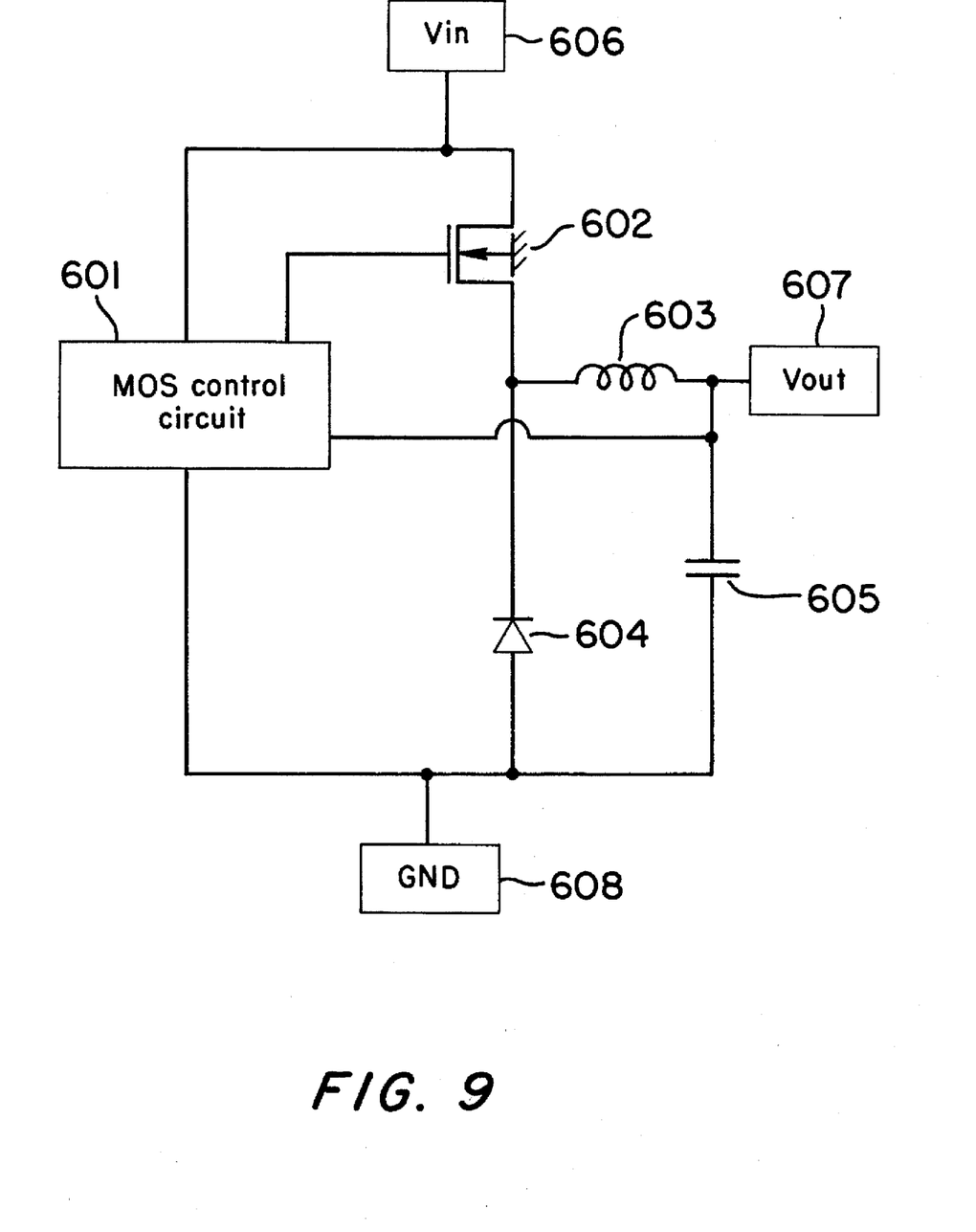
FIG. 9 is a circuit block diagram of a switching regulator of second embodiment of the invention.

FIG. 9 is a circuit block diagram of a switching regulator of a second embodiment of the invention. A switching regulator is a kind of voltage regulator and has the work of storing power in a coil (603) and supplying necessary power (current) to an output terminal (607). Adjustment of the output current is carried out by varying the frequency or duty ratio of a pulse applied to the gate electrode of a switching MOS driver (602).

If the gate oxide film thickness of the MOS driver (602) for switching is made thin, because the current value per unit channel increases, the size of the switching MOS driver (602) can be reduced and the switching speed and the sub-threshold coefficient can also be improved, and therefore improvements in transient response characteristics and output current can be seen.

Third Embodiment

Figure 10:
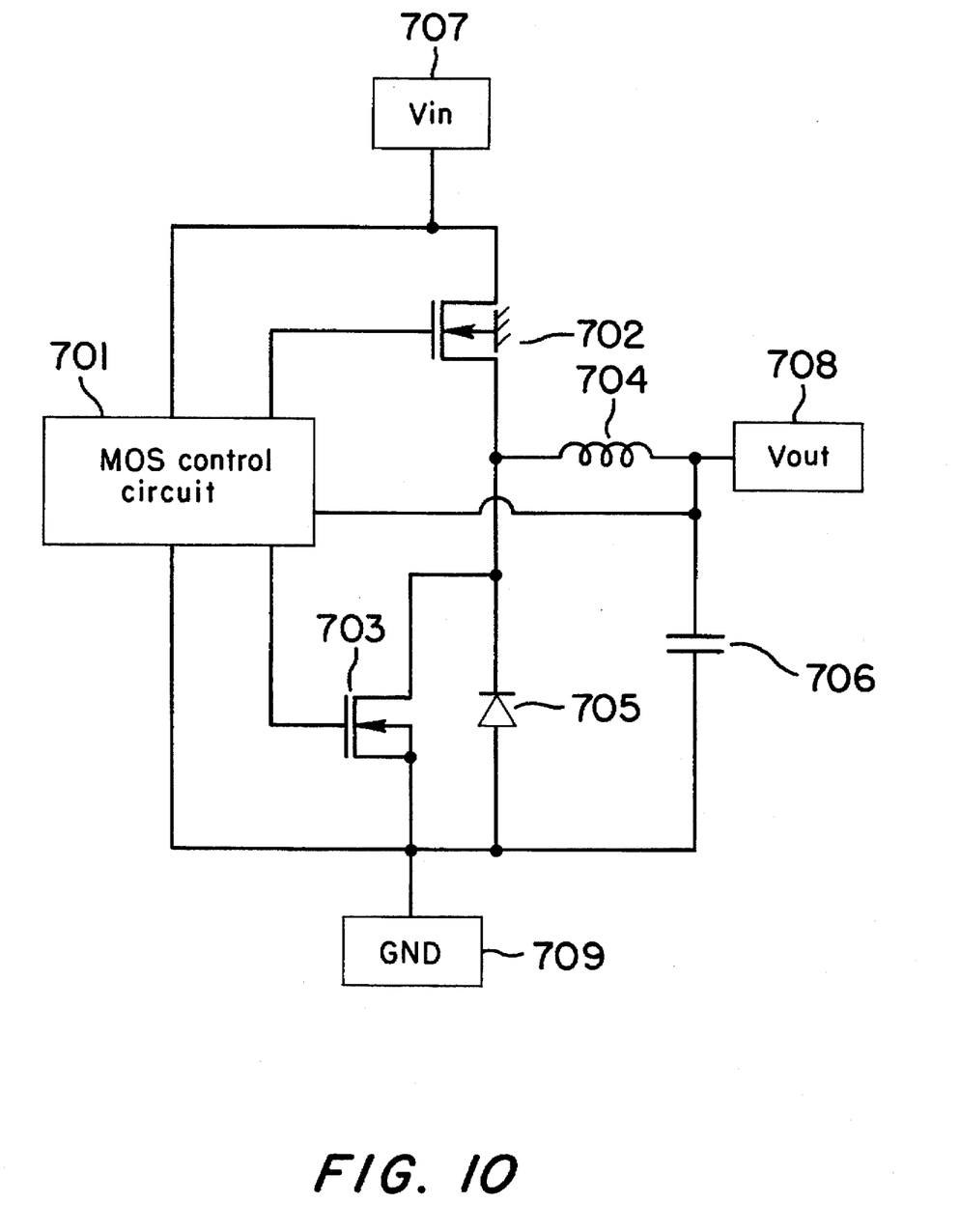
FIG. 10 is a circuit block diagram of a synchronous rectification type voltage regulator of a third embodiment of the invention.

A circuit block diagram of a synchronous rectification type voltage regulator of a third embodiment of the invention is shown in FIG. 10. A synchronous rectification type is one wherein improvement of conversion efficiency when the output voltage is small at for example 3.3V has been attempted, one which aims to supply current at once to a coil (704) with a MOS driver (702) for synchronous rectification and a rectifying diode (705), reducing the OFF time of the MOS driver (702) for switching and also reducing losses due to the rectifying diode.

By making the gate oxide films of the MOS driver (702) for switching and the MOS driver (703) for synchronous rectification thin, the switching speeds and the sub-threshold coefficients are improved and, therefore, the conversion efficiency increases further.

With this invention, in a high withstand voltage MOS-type semiconductor integrated circuit device, increase in the amount of current per unit channel and realization of high speed MOS switching were achieved.

What is claimed is:

1. A semiconductor integrated circuit device comprising: MOS transistors each having a source region and a drain region of a second conductive type formed spaced apart on a semiconductor layer of a first conductive type, a channel-forming region formed between the source region and the drain region, and a gate electrode formed on the channel-forming region with a gate insulating film disposed therebetween, the film thickness of the gate insulating film of a first one of the MOS transistors across the gate electrode and the semiconductor layer in which a high voltage is impressed being greater than the film thickness of the gate insulating film of a second one of the MOS transistors in which a low voltage is impressed; and a voltage regulator comprised of a MOS driver having the second MOS transistor, a MOS control circuit having the first MOS transistor, an input terminal for inputting a voltage, and an output terminal for outputting a voltage, the MOS driver being disposed between the input terminal and the output terminal for adjusting the voltage of the input terminal and transmitting it to the output terminal, the MOS control circuit feeding back voltage information of the output terminal and controlling the MOS driver.

2. A semiconductor integrated circuit device according to claim 1; wherein a current limiting circuit for limiting the current flowing through the MOS driver is disposed between the input terminal and the output terminal; and wherein a ladder resistor circuit is electrically connected to the output terminal for feeding back voltage information of the output terminal to the MOS control circuit.

3. A semiconductor integrated circuit device according to claim 1; wherein a coil is disposed between the MOS driver and the output terminal; and wherein a diode is disposed between the MOS driver and a ground terminal.

4. A semiconductor integrated circuit device according to claim 1; wherein a coil is disposed between the MOS driver and the output terminal; and wherein a MOS driver for synchronous rectification is provided between the MOS driver and a ground terminal, the MOS driver for synchronous rectification being controlled by the MOS control circuit.

5. A semiconductor integrated circuit device comprising:
an input terminal for inputting a voltage;
an output terminal for outputting a voltage;
a MOS driver disposed between the input terminal and the output terminal for adjusting the voltage of the input terminal and transmitting it to the output terminal, the MOS driver having a first MOS transistor formed on a semiconductor substrate, the first MOS transistor having a source region, a drain region, a channel region disposed between the source region and the drain region, a gate insulating film disposed over the channel region and having a preselected thickness, and a gate electrode disposed over the gate insulating film; and
a MOS control circuit for controlling the MOS driver and feeding back voltage information of the output terminal, the MOS control circuit having a second MOS transistor formed on a semiconductor substrate, the second MOS transistor having a source region, a drain region, a channel region disposed between the source region and the drain region, a gate insulating film disposed over the channel region and having a preselected thickness which is different from the preselected thickness of the gate insulating film of the first MOS transistor, and a gate electrode disposed over the gate insulating film.

6. A semiconductor integrated circuit device according to claim 5; wherein the preselected thickness of the gate insulating film of the first MOS transistor is greater than the preselected thickness of the gate insulating film of the second MOS transistor.

7. A semiconductor integrated circuit device according to claim 5; wherein a current limiting circuit for limiting the current flowing through the MOS driver is disposed between the input terminal and the output terminal; and wherein a ladder resistor circuit is electrically connected to the output terminal for feeding back voltage information of the output terminal to the MOS control circuit.

8. A semiconductor integrated circuit device according to claim 7; wherein the preselected thickness of the gate insulating film of the first MOS transistor is greater than the preselected thickness of the gate insulating film of the second MOS transistor.

9. A semiconductor integrated circuit device according to claim 5; wherein a coil is disposed between the MOS driver and the output terminal; and wherein a diode is disposed between the MOS driver and a ground terminal.

10. A semiconductor integrated circuit device according to claim 9; wherein the preselected thickness of the gate insulating film of the first MOS transistor is greater than the preselected thickness of the gate insulating film of the second MOS transistor.

11. A semiconductor integrated circuit device according to claim 5; wherein a coil is disposed between the MOS driver and the output terminal; and wherein a MOS driver for synchronous rectification is connected between the MOS driver and a ground terminal and controlled by the MOS control circuit.

12. A semiconductor integrated circuit device according to claim 11; wherein the preselected thickness of the gate insulating film of the first MOS transistor is greater than the preselected thickness of the gate insulating film of the second MOS transistor.

* * * * *